United States Patent
Yang et al.

(10) Patent No.: US 10,490,598 B2
(45) Date of Patent: Nov. 26, 2019

(54) LIGHT-EMITTING STRUCTURE HAVING A PLURALITY OF LIGHT-EMITTING STRUCTURE UNITS

(71) Applicant: EPISTAR CORPORATION, Hsinchu (TW)

(72) Inventors: Jhih-Yong Yang, Hsinchu (TW); Hui-chun Yeh, Hsinchu (TW); Chien-Fu Shen, Hsinchu (TW); Tsun-Kai Ko, Hsinchu (TW)

(73) Assignee: EPISTAR CORPORATION, Hsinchu (TW)

(*) Notice: Subject to any disclaimer, the term of this patent is extended or adjusted under 35 U.S.C. 154(b) by 0 days.

(21) Appl. No.: 15/605,532

(22) Filed: May 25, 2017

(65) Prior Publication Data

US 2017/0263674 A1    Sep. 14, 2017

Related U.S. Application Data

(63) Continuation-in-part of application No. 15/196,717, filed on Jun. 29, 2016, now Pat. No. 10,062,730.
(Continued)

(51) Int. Cl.
*H01L 33/20* (2010.01)
*H01L 27/15* (2006.01)
(Continued)

(52) U.S. Cl.
CPC ........ *H01L 27/156* (2013.01); *H01L 25/0753* (2013.01); *H01L 27/153* (2013.01);
(Continued)

(58) Field of Classification Search
CPC ....... H01L 33/38; H01L 33/385; H01L 33/00; H01L 33/483; H01L 25/0753;
(Continued)

(56) References Cited

U.S. PATENT DOCUMENTS

| 5,075,253 A | 12/1991 | Sliwa, Jr. |
| 6,784,105 B1 | 8/2004 | Yang et al. |

(Continued)

FOREIGN PATENT DOCUMENTS

| CN | 101276871 A | 10/2008 |
| CN | 101685842 A | 3/2010 |

(Continued)

*Primary Examiner* — Sue A Purvis
*Assistant Examiner* — Suberr L Chi
(74) *Attorney, Agent, or Firm* — Ditthavong & Steiner, P.C.

(57) ABSTRACT

A light-emitting structure, comprising: a first light-emitting structure unit and a second light-emitting structure unit, adjacent to and spaced apart from each other; and an electrical connection arranged on the first light-emitting structure unit and the second light-emitting structure unit, and electrically connecting the first light-emitting structure unit and the second light emitting structure unit; wherein the first light-emitting structure unit comprises a first side surface and a second side surface; wherein the first side surface is between the first and the second light-emitting structure units, and the second side surface is not between the first light-emitting structure unit and the second light-emitting structure unit; and wherein the first side surface is inclined and a slope of the first side surface is gentler than a slope of the second side surface.

13 Claims, 9 Drawing Sheets

Related U.S. Application Data which is a continuation of application No. 14/924,264, filed on Oct. 27, 2015, now Pat. No. 9,406,719, which is a continuation of application No. 13/230,988, filed on Sep. 13, 2011, now Pat. No. 9,196,605.

(60) Provisional application No. 61/382,451, filed on Sep. 13, 2010.

(51) Int. Cl.
*H01L 25/075* (2006.01)
*H01L 33/44* (2010.01)
*H01L 33/38* (2010.01)
*H01L 33/62* (2010.01)

(52) U.S. Cl.
CPC .............. *H01L 33/44* (2013.01); *H01L 33/20* (2013.01); *H01L 33/382* (2013.01); *H01L 33/385* (2013.01); *H01L 33/62* (2013.01); *H01L 2924/00* (2013.01); *H01L 2924/0002* (2013.01)

(58) Field of Classification Search
CPC ............................................................................ H01L 27/153; H01L 25/0756; H01L 27/156; H01L 33/20; H01L 33/44; H01L 33/62

See application file for complete search history.

(56) References Cited

U.S. PATENT DOCUMENTS

| | | |
|---|---|---|
| 8,030,669 B2 | 10/2011 | Shakuda et al. |
| 9,093,627 B2 | 7/2015 | Lee et al. |
| 2005/0186712 A1 | 8/2005 | Smith |
| 2006/0157717 A1 | 7/2006 | Nagai et al. |
| 2007/0152226 A1 | 7/2007 | Salam |
| 2010/0059768 A1 | 3/2010 | Hasnain |
| 2014/0175465 A1* | 6/2014 | Lee .................. H01L 27/15 257/88 |

FOREIGN PATENT DOCUMENTS

| | | |
|---|---|---|
| CN | 101783378 A | 7/2010 |
| JP | 2002359402 A | 12/2002 |
| JP | 3654745 B2 | 6/2005 |
| JP | 2006080441 A | 3/2006 |
| JP | 2010118624 A | 5/2010 |
| KR | 10-0679449 B1 | 2/2007 |
| KR | 10-0690323 B1 | 2/2007 |
| KR | 1020080002161 A | 1/2008 |
| KR | 1020100097028 A | 9/2010 |
| TW | 201031036 A | 8/2010 |
| TW | 201031036 A1 | 8/2010 |
| TW | 201031977 A | 9/2010 |
| TW | 201031977 A1 | 9/2010 |

\* cited by examiner

LIGHT-EMITTING STRUCTURE HAVING A PLURALITY OF LIGHT-EMITTING STRUCTURE UNITS

CROSS-REFERENCE TO RELATED APPLICATIONS

This application a continuation-in-part application of U.S. patent application Ser. No. 15/196,717, entitled "LIGHT EMITTING STRUCTURE", filed on Jun. 29, 2016, which claims the right of priority based on U.S. patent application Ser. No. 14/924,264, entitled "LIGHT EMITTING STRUCTURE", filed on Oct. 27, 2015, now U.S. Pat. No. 9,406,719, which claims the right of priority based on U.S. patent application, Ser. No. 13/230,988, entitled "LIGHT EMITTING STRUCTURE", filed on Sep. 13, 2011, now U.S. Pat. No. 9,196,605, which claims the right of priority based on U.S. provisional application Ser. No. 61/382,451, filed on Sep. 13, 2010, and the content of which is hereby incorporated by reference in its entirety.

TECHNICAL FIELD

The present application relates to a light-emitting structure, and more particularly to a light-emitting structure having at least two light-emitting structure units and an electrical connection for connecting the light-emitting structure units.

DESCRIPTION OF BACKGROUND ART

A light-emitting diode array is constructed by electrically connecting several light-emitting diodes in series or parallel. One diode is electrically separated from another by a trench or groove. To connect the separated diodes, metal line(s) or film(s) can be used to span the trench between the diodes. However, the metal line(s) or film(s) can be easily damaged during the manufacturing process due to a high aspect ratio of the trench.

SUMMARY OF THE DISCLOSURE

An embodiment of the present application discloses a light-emitting structure, comprising: a first light-emitting structure unit and a second light-emitting structure unit, adjacent to and spaced apart from each other; and an electrical connection arranged on the first light-emitting structure unit and the second light-emitting structure unit, and electrically connecting the first light-emitting structure unit and the second light emitting structure unit; wherein the first light-emitting structure unit comprises a first side surface and a second side surface; wherein the first side surface is between the first and the second light-emitting structure units, and the second side surface is not between the first light-emitting structure unit and the second light-emitting structure unit; and wherein the first side surface is inclined and a slope of the first side surface is gentler than a slope of the second side surface.

Another embodiment of the present application discloses a light-emitting structure, comprising: a first light-emitting structure unit and a second light-emitting structure unit, adjacent to and spaced apart from each other, wherein the first light-emitting structure unit comprises a step-like side surface facing the second light-emitting structure unit; an insulating layer, formed on the step-like side surface; and an electrical connection, formed on the insulating layer and electrically connecting the first light-emitting structure unit and the second light-emitting structure unit.

DESCRIPTIONS OF EMBODIMENTS

Figure 1:
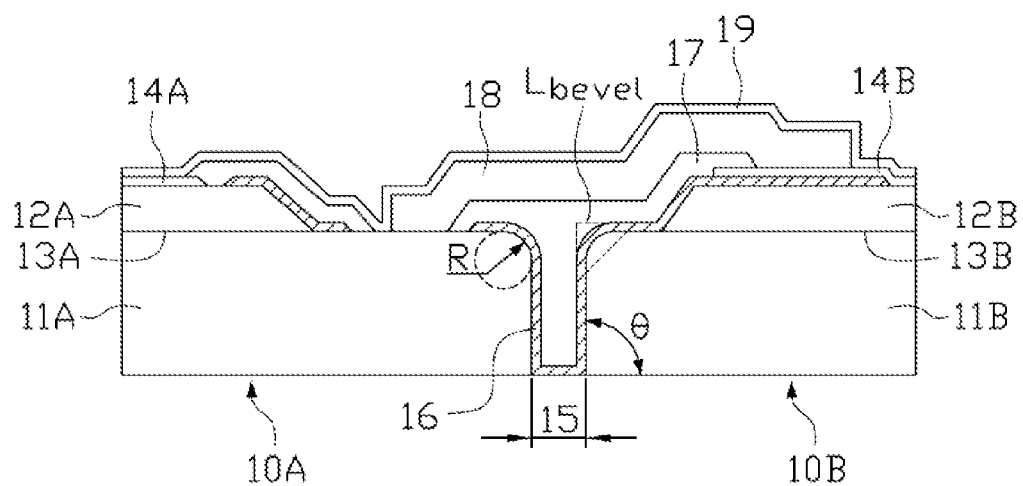
FIG. 1 illustrates a cross-sectional view disclosing a connection between two light-emitting structure units in accordance with an embodiment of the present invention.

FIG. 1 illustrates a cross-sectional view disclosing a connection between two light-emitting structure units in accordance with an embodiment of the present invention. Each of the left light-emitting structure unit 10A and the right light-emitting structure unit 10B includes a lower layer (11A, 11B), an upper layer (12A, 12B), a light-emitting junction (13A, 13B) between the lower layer (11A, 11B) and the upper layer (12A, 12B), and a current spreading layer (14A, 14B), which are sequentially formed on a substrate (not shown) by epitaxial growth or bonding method such as metal boding, fusion bonding, and glue bonding.

The left light-emitting structure unit 10A and the right light-emitting structure unit 10B can be supported by a common substrate or discrete substrates, and electrically separated by a trench 15. For example, the light-emitting structure units 10A and 10B can be commonly formed on a single bulk substrate, such as sapphire, GaAs, Si, metal, glass, or PCB; or each light-emitting structure unit is formed on its independent bulk substrate as described aforementioned, while each independent bulk substrate can be further integrated together by mechanical gadgets, organic material, metallic material, or any combination thereof. The trench 15 is formed to reach to, enter in, or penetrate the substrate or any layer between the units. The trench 15 has a cross-sectional profile of at least one rounded edge and/or at least one chamfered edge. The rounded edge and/or the chamfered edge can be formed on a single layer or several layers.

For example, as shown in the drawing, the rounded edge and/or the chamfered edge can be formed on the lower layer 11A and/or the lower layer 11B. However, the rounded edge and/or the chamfered edge can be also formed on both of the upper layer and the lower layer. The rounded edge preferably has a radius R not less than 1 μm. The chamfered edge can have two equal or different bevel lengths ($L_{bevel}$).

Moreover, a sidewall of the trench is inclined by more than 80 degree against the bottom surface of the lower layer. For example, the angle θ between the sidewall and the bottom surface of the lower layer, as illustrated in the drawing, is smaller than 80 degree, 70 degree, 60 degree, 50 degree, or 40 degree. The angle θ can also fall within a specific range, such as 80 degree~70 degree, 70 degree~60 degree, and 60 degree~40 degree. Besides, the trench may have sidewalls inclined at similar or different angles. For example, one sidewall is inclined at an angle of 50 degree~40 degrees; the other sidewall is inclined at an angle of 60 degree~50 degree. Provided one or more sidewalls are inclined, the trench can have a trapezoid cross section having a height, a longer side, and a shorter side parallel to the longer side. The height is close to the thickness of the lower layer or the total thickness of the upper layer and the lower layer. For example, the height is between 1 μm~10 μm; the longer side has a length of 3 μm~100 μm; the shorter side has a length of 1 μm~40 μm; the ratio of the longer side to the short side is between 3:1 and 1.5:1. Specifically, the height is between 4 μm~9 μm; the length of the longer side is between 5 μm~40 μm; the length of the shorter side is between 2.5 μm~20 μm.

To build an electrical passage between the units, an electrical connection 18 bridges the trench 15 and electrically connects any two layers, which do not belong to the same unit, of the lower layer 11A, lower layer 11B, upper layer 12A, and upper layer 12B. For example, the units can be coupled together in series connection by bridging the lower layer 11A and the upper layer 12B, or the upper layer 12A and the lower layer 11B; the units can be coupled in parallel connection by bridging the upper layer 12A and upper layer 12B.

To prevent the electrical connection 18 from unintentionally contacting with other layer, an isolation layer 16 can be also provided on the trench 15 and some areas near the trench opening, such as the sidewall(s) of the lower layer 11A and/or the lower layer 11B, the edge(s) of the trench 15, the sidewall(s) of the upper layer 12A and/or the upper layer 12B, the top surface(s) of the upper layer 12A and/or the upper layer 12B, and/or the bottom surface(s) of the current spreading layer 14A and/or the current spreading layer 14B. Optionally, an isolation layer 17 can be further provided between the isolation layer 16 and the electrical connection 18. The isolation layer 17 can be used to fill the empty space between the isolation layer 16 and the electrical connection 18, to fill voids on the isolation layer 16, to smooth the outer surface of the isolation layer 16, to fill the trench 15, to form a flat plane for laying the electrical connection 18, to cover area(s) not under the shade of the isolation layer 16, to improve ESD protection, and/or to support the electrical connection 18.

The isolation layer 16 can have an edge with an acute angle; the layer laid on the isolation layer 16 therefore can smoothly cover the drop on the edge of the isolation layer 16. The slope of the edge can release the stress concentrated on the layer over the drop. The acute angle can be less than 90, 80, 70, 60, or 50 degree. Besides the isolation layer 16, the isolation layer 17 can also have an edge with an acute angle.

In addition, to protect the electrical connection 18 from oxidation, erosion, and/or damage, a passivation 19 can be formed on the electrical connection 18. The passivation 19 can cover not only outer surface(s) of the electrical connection 18 but also the area beyond the outer surface(s). Specifically, the passivation 19 can be further formed on any surfaces of the isolation layer 17, the current spreading layer 14A, the current spreading layer 14B, the upper layer 12A, the upper layer 12B, the lower layer 11A, and/or the lower layer 11B.

Figure 2:
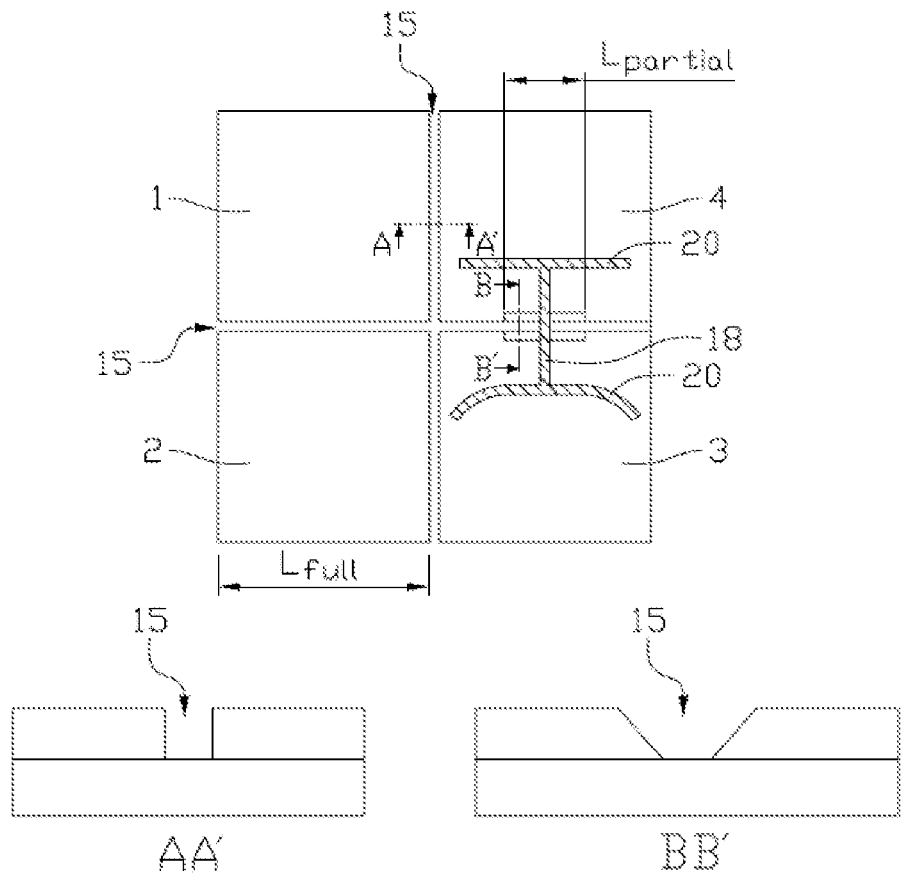
FIG. 2 illustrates a top view of light-emitting structure units in accordance with an embodiment of the present invention.

FIG. 2 illustrates a top view of light-emitting structure units in accordance with an embodiment of the present invention. In the drawing, four rectangular light-emitting structure units 1, 2, 3, 4 are deployed in a 2×2 array; however, the shape, the number, and the deployment of the light-emitting structure units are only illustrative but not to limit applications and variations of the present invention.

The light-emitting structure units 1, 2, 3, 4 are laterally separated by trenches 15. An electrical connection 18 can bridge the trench 15 from one light-emitting structure unit (for example, unit 3) to another light-emitting structure unit (for example, unit 4) and couple the two units in series or parallel connection. As shown in cross section AA', the trench 15 (for example, between units 1 and 4) on which no electrical connection 18 is formed has steeper sidewalls, therefore, more volume of the light-emitting structure unit resides nearby the trench 15. In contrast, as shown in cross section BB', the trench 15 (for example, between units 3 and 4) on which the electrical connection 18 is formed has less steep sidewalls in comparison with the sidewalls in the cross section AA'. In one embodiment, some of the light-emitting structure units are removed to form a trench having a ladder-shaped, and/or inclined sidewall. In other words, the trench has a reversed-trapezoid or quasi-reversed-trapezoid cross-sectional profile. For example, the method for forming the trench can be selected from wet etching, dry etching, laser machining, diamond scribing, and any combination thereof. In general, the steeper the sidewall is, the shorter the processing time is taken.

In addition, the less steep sidewall can be formed on either a full length trench $L_{full}$ or a partial length trench $L_{partial}$ (as illustrated in FIG. 2). The full length trench $L_{full}$ herein is defined as a trench having a length similar to the width of the light-emitting structure unit; the partial length trench $L_{partial}$ is defined as a trench has a length smaller than the width of the light-emitting structure unit. For example, $L_{partial}$ is between 10 μm~100 μm; the width of the light-emitting structure unit is between 100 μm~1000 μm; the ratio of $L_{partial}$ to width of the light-emitting structure unit is between 1:2~1:10. Moreover, the electrical connection 18 can be further connected with a current network 20 through which current can come from or flow to a position far away from the electrical connection 18, as shown in FIG. 5.

Figure 3:
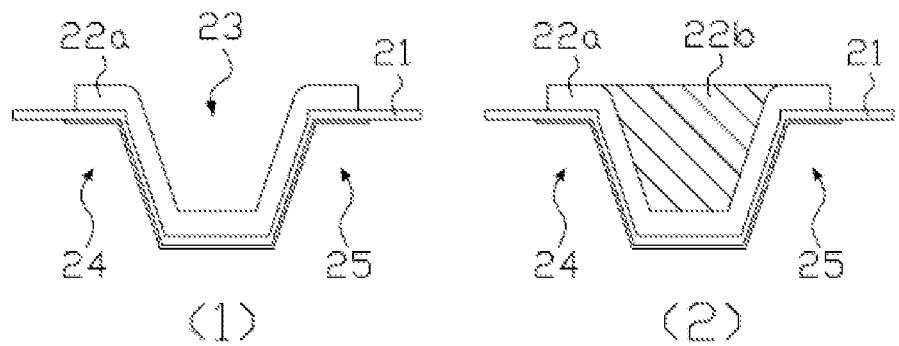
FIG. 3 illustrates a filling of the trench in accordance with an embodiment of the present invention.

FIG. 3 illustrates a filling of the trench. In step (1), an isolation layer 21 and a lower electrical connection 22a are sequentially provided on a trench 23 which is formed between two light-emitting structure units 24, 25. The isolation layer 21 can separate the lower electrical connection 22a from contacting with the light-emitting structure units 24, 25. The lower electrical connection 22a can electrically link two light-emitting structure units 24, 25. The lower electrical connection 22a can be formed by deposition and etching processes. Because the trench 23 has a tapered cross section, the inclined portion of the lower electrical connection 22a therefore usually is thinner than the flat portions thereof, and can be easily damaged during following processes. To reinforce the inclined portion of the lower electrical connection 22a, an upper electrical connection 22b is further provided on the lower electrical connection 22a. The upper electrical connection 22b is preferably provided on the top of the inclined portion or within the trench 23, as shown in step (2).

Figure 4:
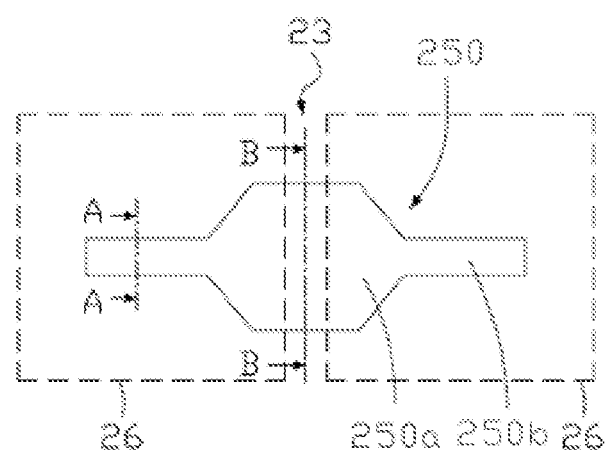
FIG. 4 illustrates a top view of an electrical connection over a trench in accordance with an embodiment of the present invention.
Figure 4:
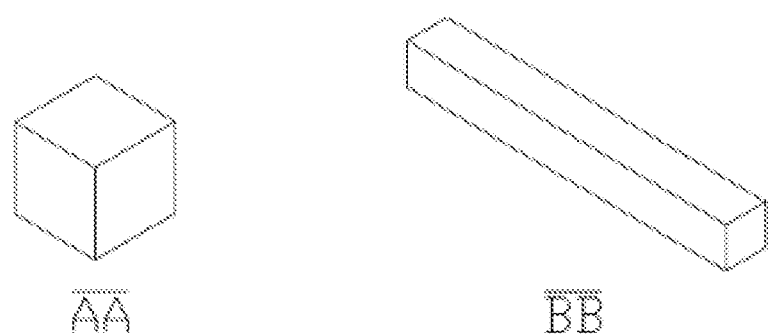

FIG. 4 illustrates a top view of an electrical connection over a trench between two light-emitting structure units in accordance with one embodiment of the present invention. The electrical connection 250 has a bridging portion 250a over the trench 23 and two joining portions 250b. Each of the two joining portions 250b is electrically connected to an anode or a cathode on each of the two light-emitting structure units 26. The bridging portion 250a has a BB cross section; the joining portion 250b has an AA cross section. The BB cross section has a width greater than that of the AA cross section, while the two cross sections can have equal or close area for achieving a constant or even electrical current per cross sectional area. For example, the bridging portion 250a has a width of 5 µm~50 µm; the joining portion 250b has a width of 3 µm~15 µm while both of them has a thickness close to 8 µm. However, the two cross sections can also have different area according to user's requirements or practical manufacturing processes. The bridging portion 250a can be constructed after the basic electrical connection manufacturing process is completed. For example, the electrical connection 250 over the trench 23 which has inclined sidewalls is firstly formed by depositing metal on specific areas of the trench 23 and the light-emitting structure units 26. But the deposited metal on the inclined sidewalls of the trench 23 is usually thinner than the deposited metal on the light-emitting structure unit 26, and the deposited metal bridging the two light-emitting structure units therefore has various cross sectional area. To increase the volume or the cross sectional area of the metal over the trench 23, an extra-deposition process is further applied on the thinner deposited metal area to form the bridging portion 250a as described above. Furthermore, the volume or the cross sectional area of the electrical connection 250 over the trench 23 can be increased by other methods, such as bonding one or more supplement articles on the thinner electrical connection portions, and depositing other material(s). The supplement article is such as metal and ceramic. Moreover, the thicker electrical connection portions can be even thinned down to the level similar to the portions over the trench 23.

Figure 5:
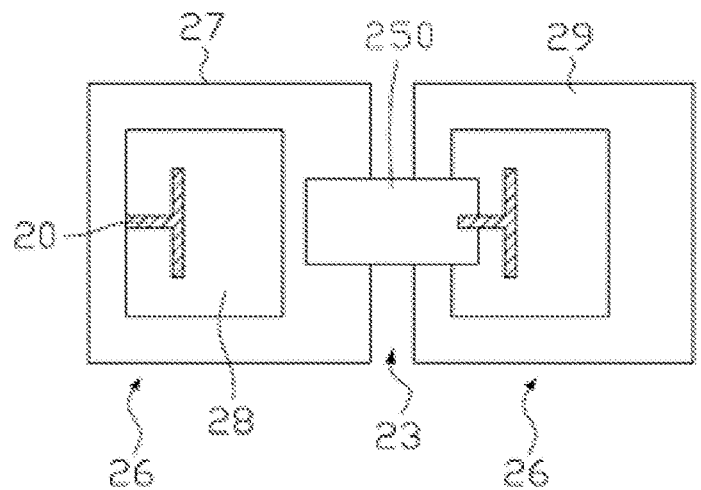
FIG. 5 illustrates a top view of an electrical connection over a trench between two light-emitting structure units in accordance with another embodiment of the present invention.

FIG. 5 illustrates a top view of an electrical connection 250 over a trench 23 between two light-emitting structure units in accordance with another embodiment of the present invention. Each of the light-emitting structure unit 26 includes a lower layer 27 and an upper layer 28 having a smaller area than that of the lower layer 27. The lower layer 27 has a mesa area 29 surrounding the upper layer 28. The light-emitting structure unit 26 can emit light from a light-emitting layer which is positioned within the upper layer 28 or between the upper layer 28 and the lower layer 27. Provided the light-emitting layer is positioned within the upper layer 28, the upper layer 28 can include a p-type semiconductor layer and an n-type semiconductor layer, between which the light-emitting layer is sandwiched; and the lower layer 27 can include a carrier for supporting the upper layer 28. The upper layer 28 can be epitaxially grown on the lower layer 27, or be integrated with the lower layer 27 by glue bonding, metal bonding, fusion bonding, or eutectic bonding. Provided the light-emitting layer is positioned between the upper layer 28 and the lower layer 27, either the upper layer 28 or the lower layer 27 can include a p-type semiconductor layer, and the other can include an n-type semiconductor layer.

To build a current passage from one light-emitting structure unit to another, an electrical connection 250 is provided on the two light-emitting structure units 26. As shown in the drawing, one end of the electrical connection 250 is installed on the upper layer 28, and the other end is installed on the lower layer 27. However, the two ends of the electrical connection 250 can be also installed on two upper layers 28 or two lower layers 27. The electrical connection 250 can be constructed by metal, semiconductor, metal oxide, or any combination thereof. Provided a metal oxide, which has higher transparency than that of metal, is used to form the electrical connection 250, fewer light escaping areas are therefore shaded by the electrical connection 250. The metal oxide is such as ITO, IZO, and CTO.

Figure 6:
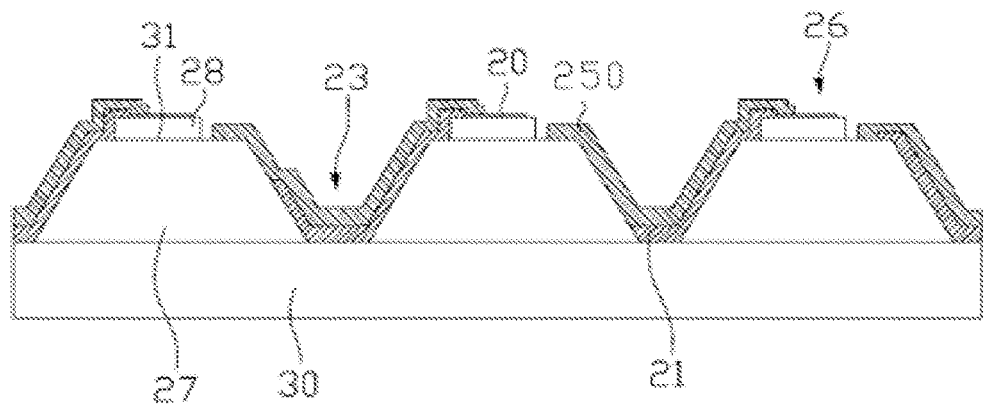
FIG. 6 illustrates a cross-sectional view of interconnections between light-emitting structure units in accordance with one embodiment of the present invention.

FIG. 6 illustrates a cross-sectional view of interconnections between light-emitting structure units in accordance with one embodiment of the present invention. Each light-emitting structure unit 26 includes an upper layer 28 and a lower layer 27 formed on a common substrate 30 by epitaxial growth and/or bonding method. The bonding method includes but not limited to metal bonding, eutectic bonding, glue bonding, and fusion bonding. A light-emitting zone 31 is sandwiched by the upper layer 28 and the lower layer 27. The light-emitting zone 31 can generate light when a bias voltage is imposed on the upper layer 28 and the lower layer 27. The light from the light-emitting zone 31 radiates isotropically.

Two light-emitting structure units 26 are separated by a trench 23. Provided the two light-emitting structure units 26 are coupled in series connection, an isolation layer 21 is formed on the trench 23 to leave the electrical connection 250 touching the upper layer 28 of one light-emitting structure unit 26 and the lower layer 27 of another light-emitting structure unit 26. In this embodiment, the isolation layer 21 is formed to expose not only the top surface but a portion of the sidewall of the lower layer 27. The exposure of the sidewall of the lower layer 27 can increase the contact area between the electrical connection 250 and the lower layer 27, and accordingly the current density can decrease.

Figure 7:
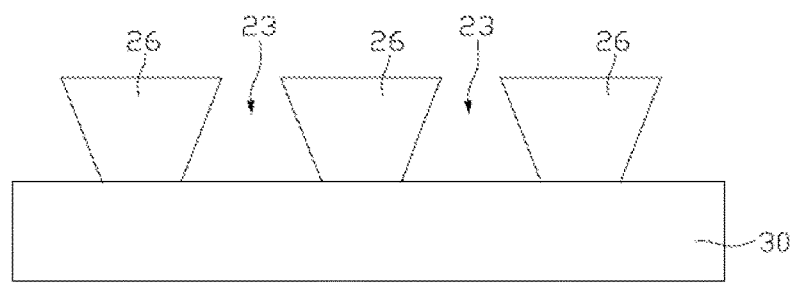
FIG. 7 illustrates a cross sectional view of several light-emitting structure units in accordance with an embodiment of the present invention.

FIG. 7 illustrates a cross sectional view of several light-emitting structure units in accordance with an embodiment of the present invention. The several light-emitting structure units 26 are supported by a substrate 30. Two neighboring light-emitting structure units 26 are separated by a trench 23. In the present embodiment, the trench 23 is trapezoid-shaped and has a narrower top opening and a wider bottom. The light-emitting structure unit 26 nearby the trench 23 therefore has an undercut sidewall with a degree greater than 90 degree, as shown in the drawing. In other words, the light-emitting structure unit 26 has a reversed trapezoid shape. Provided the light-emitting structure unit 26 can emit light from the middle part, the central part, or the upper part of the reversed trapezoid, the light moving backwards can leave the unit 26 on the benefit of the undercut sidewalls. The trapezoid-shaped trench can be formed by using over etching process.

In accordance with one embodiment of the present invention, the light-emitting structure unit can include at least a first conductivity layer (for example, the upper layer), a conversion unit (for example, the light-emitting zone), and a second conductivity layer (for example, the lower layer). Each of the first conductivity layer and the second conductivity layer has a single layer or a group of multiple layers ("multiple layers" means two or more layers), and the two single layers or the two groups of the multiple layers, which are respectively located on the first and the second conductivity layers, have distinct polarities or distinct dopants. For example, the first conductivity layer is a p-type semiconductor layer; the second conductivity layer is an n-type semiconductor layer. The conversion unit disposed between the first conductivity layer and the second conductivity layer is a region where the light energy and the electrical energy could be transferred or induced to transfer. The one that the electrical energy can be transferred to the light energy is such as a light-emitting diode, a liquid crystal display, and an organic light-emitting diode. The one that the light energy can be transferred to the electrical energy is such as a solar cell, and an optoelectronic diode.

The transferred light emission spectrum of the light-emitting diode can be controlled by changing the physical or chemical arrangement of one layer or more layers in the light-emitting diode. The light-emitting diode can be composed of several materials, such as the series of aluminum gallium indium phosphide (AlGaInP), the series of aluminum gallium indium nitride (AlGaInN), and/or the series of zinc oxide (ZnO). The conversion unit can be configured to be a single heterostructure (SH), a double heterostructure (DH), a double-side double heterostructure (DDH), or a multi-quantum well (MWQ). Besides, the wavelength of the emitting light could be controlled by changing the number of the pairs of the quantum well.

The material of the substrate(s) used for growing or supporting the light-emitting structure unit(s) can include but not limits to germanium (Ge), gallium arsenide (GaAs), indium phosphide (InP), sapphire, silicon carbide (SiC), silicon (Si), lithium aluminium oxide (LiAlO2), zinc oxide (ZnO), gallium nitride (GaN), aluminum nitride (AlN), glass, composite, diamond, CVD diamond, diamond-like carbon (DLC) and any combination thereof.

FIGS. 8A through 8F illustrate a method of forming light-emitting structure unit(s), or more specific to light emitting diode structures, in accordance with another embodiment of the present invention. Firstly, referring to FIG. 8A, a substrate 41 is provided. The material of the substrate 41 can be silicon, silicon carbide, sapphire, arsenide, phosphide, zinc oxide, and magnesium oxide. Then, a 1st semiconductor layer 42 which is an epitaxy layer of first conductivity, an active layer 43, and a 2nd semiconductor layer 44 which is an epitaxy layer of second conductivity are formed on the substrate 41. The material of the 1st semiconductor layer 42 and the 2nd semiconductor layer 44 include but not limited to an indium-containing nitride semiconductor, an aluminum-containing nitride semiconductor, and a gallium-containing nitride semiconductor. The material of the active layer 43 include but not limited to indium gallium nitride, indium gallium aluminum phosphide, aluminum gallium nitride, aluminum gallium arsenide, and indium gallium arsenide.

Figure 8A:
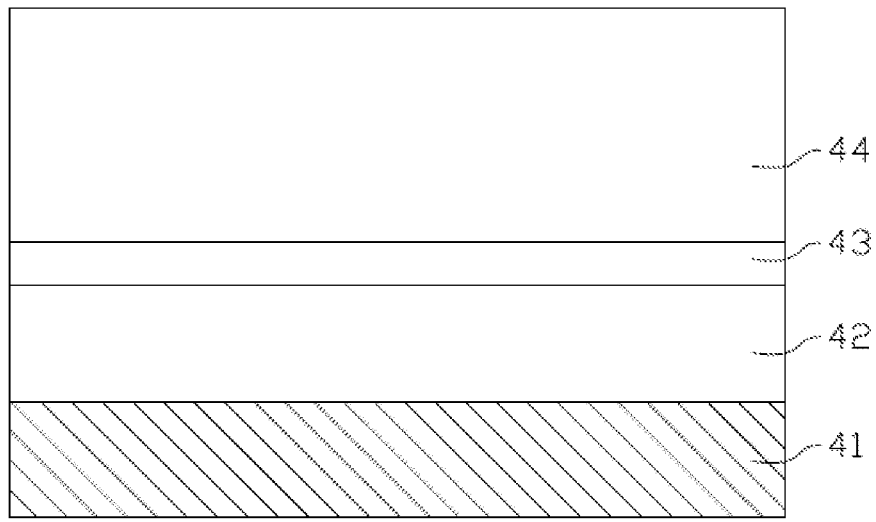
FIGS. 8A-8F illustrate steps of forming light-emitting structure unit in accordance with an embodiment of the present invention.
Figure 8B:
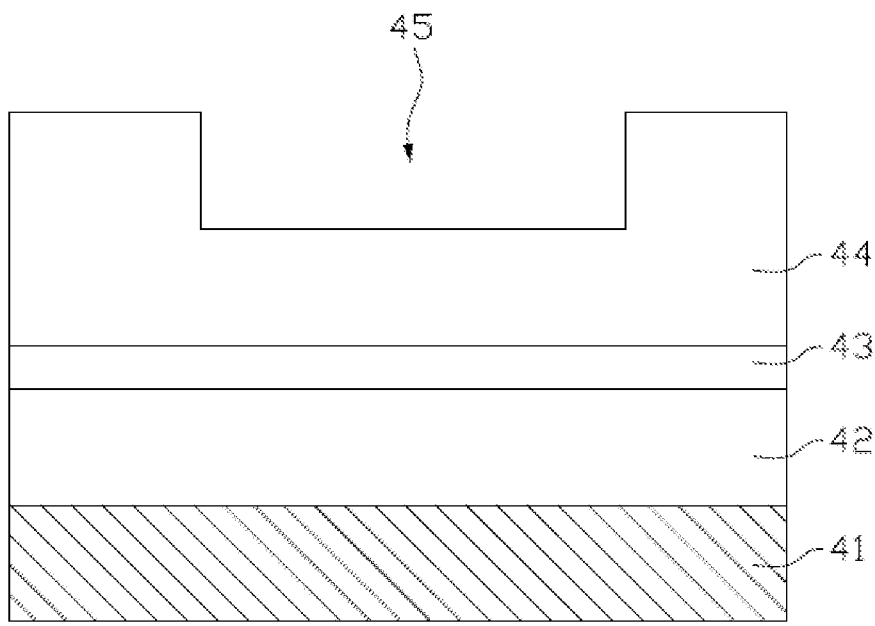
Figure 8C:
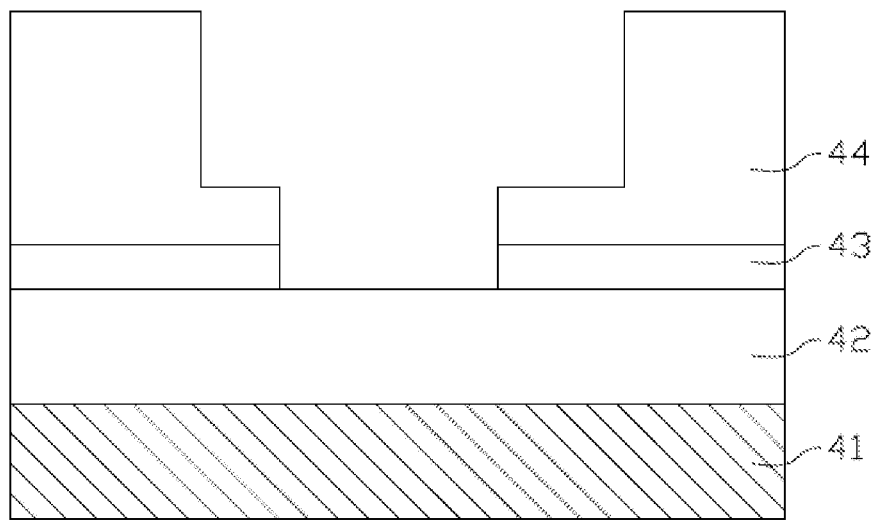
Figure 8D:
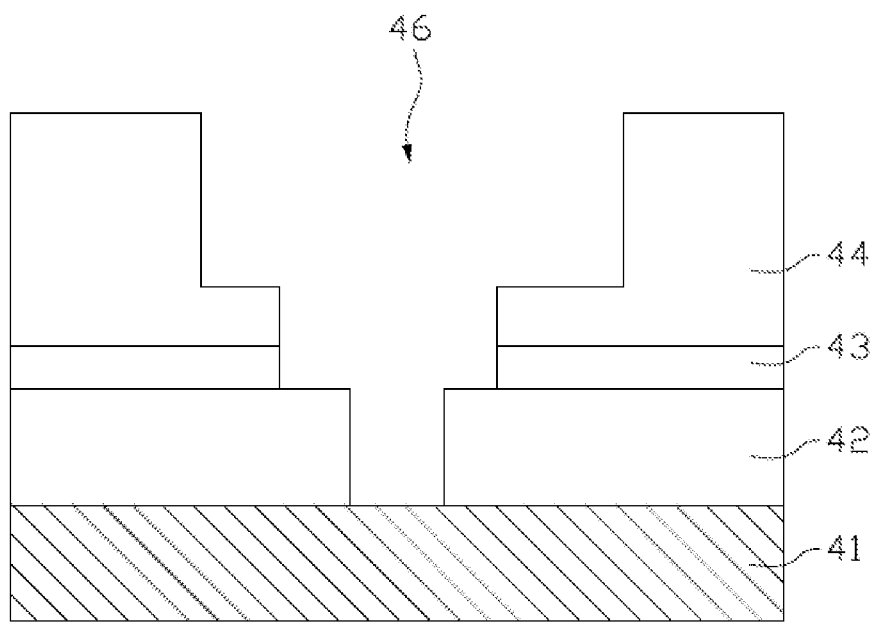

Referring to FIGS. 8B-8D, a multi-step patterning process is performed. Firstly, a first region of the 2nd semiconductor layer 44 is defined so that the 2nd semiconductor layer 44 has a concave portion 45 therein by photolithography and etching technology. Then, as shown in FIG. 8C, a second etching process is performed to etch away partial of the 2nd semiconductor layer 44 and partial of the active layer 43 until a surface of the 1st semiconductor layer 42 is exposed. Finally, as shown in FIG. 8D, a third pattern process is performed to divide the 1st semiconductor layer 42 by forming a trench 46 therebetween through the photolithography and etching technology. After the multi-step patterning process, light emitting diode structure are divided with the step-like sidewall profiles as shown in FIG. 8D.

Figure 8E:
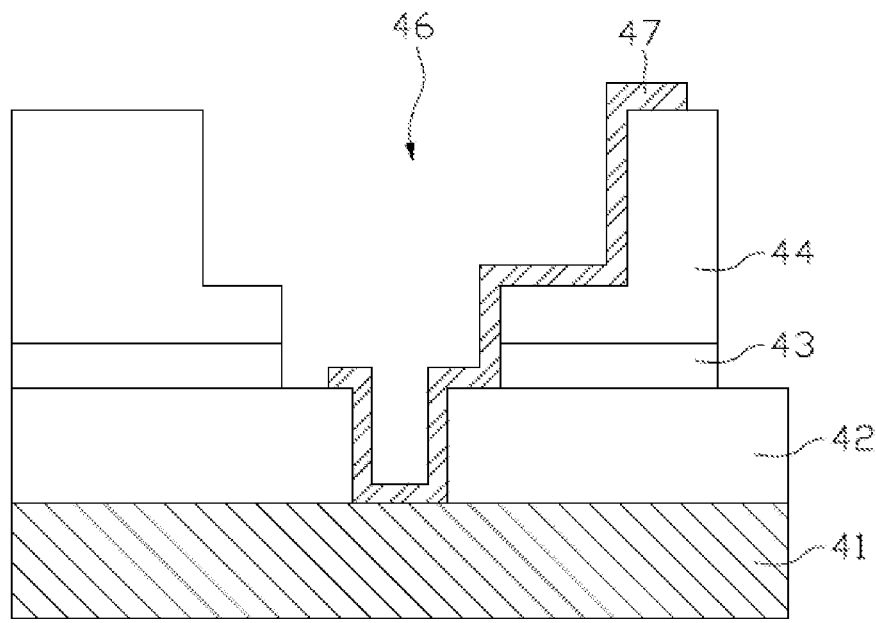
Figure 8F:
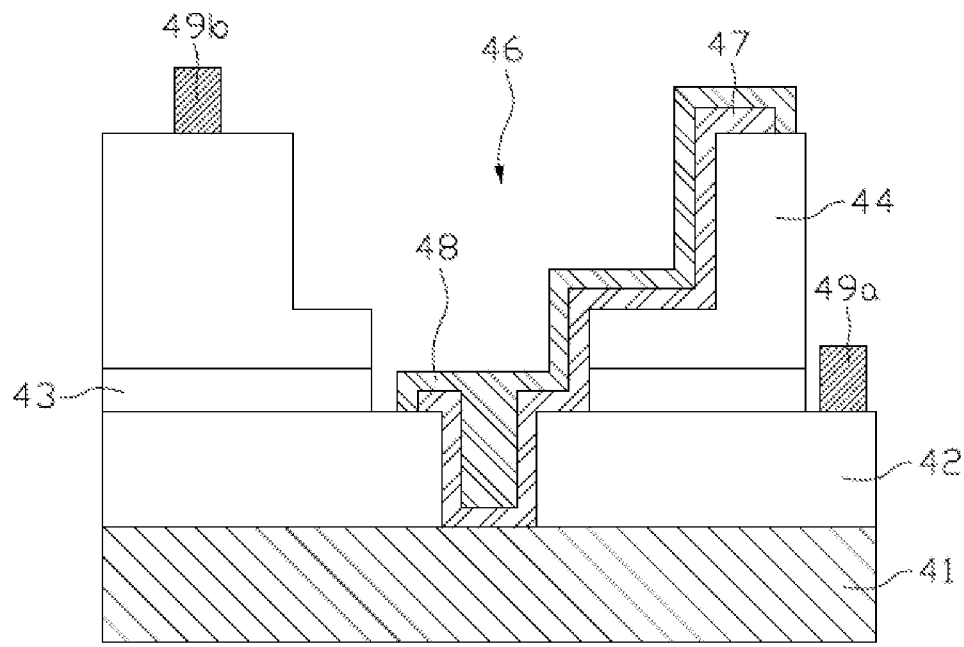

Referring to FIG. 8E, an insulating layer 47 is further formed between two divided light emitting diode structures 40 to cover the step-like sidewalls of the adjacent light emitting diode structures. Wherein, the insulating layer 47 is made of dielectric material such as silicon nitride, silicon oxide, aluminum oxide, and the combination thereof. Then, as shown in FIG. 8F, a conductive structure 48 is formed on the insulating layer 47 to electrically connect the 1st semiconductor layer 42 of the left light emitting diode structure and the 2nd semiconductor layer 43 of the right light emitting diode structure in series. In addition, a 1st electrode 49a and a 2nd electrode 49b can also be formed at the same step or in the different steps while the conductive structure 48 is formed.

In addition to the patterning process mentioned above, the step-like sidewalls could also be formed by using a gray-tone mask or by a half-tone mask. Taking advantage of different opening ratio existing on a single mask, the step-like sidewall profile can be formed through a one-step exposure.

Figure 9:
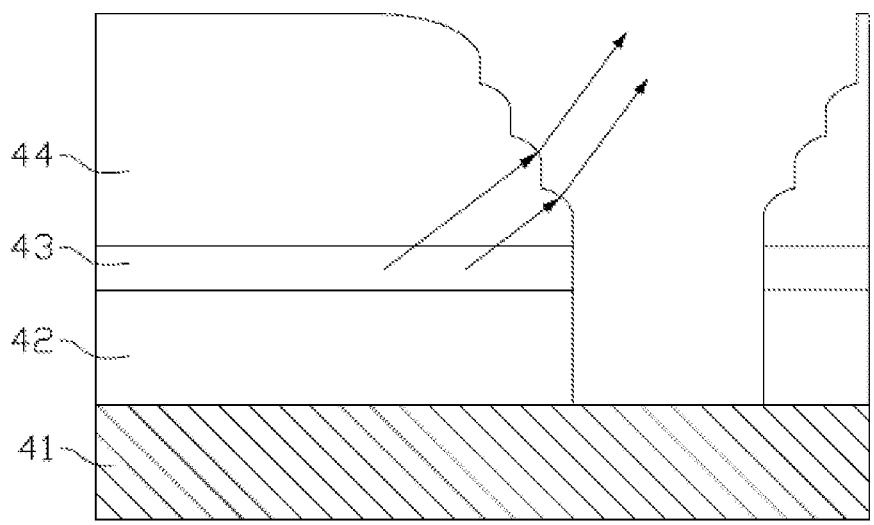
FIG. 9 illustrates a cross sectional view of a light-emitting structure unit in accordance with an embodiment of the present invention.

Referring to FIG. 9, through the step-like sidewall structure, light (as indicated by arrows) comes from different angles can be extracted more easily because the light can go out to the sidewall of the light emitting diodes from different angles, and therefore a better light extraction ability of the light emitting diode structure could be achieved. Besides, because the slope of the step-like sidewalls is gentle, the coverage profile of the insulating layer and the conductive structure on the light emitting diode can be more uniform.

Figure 10:
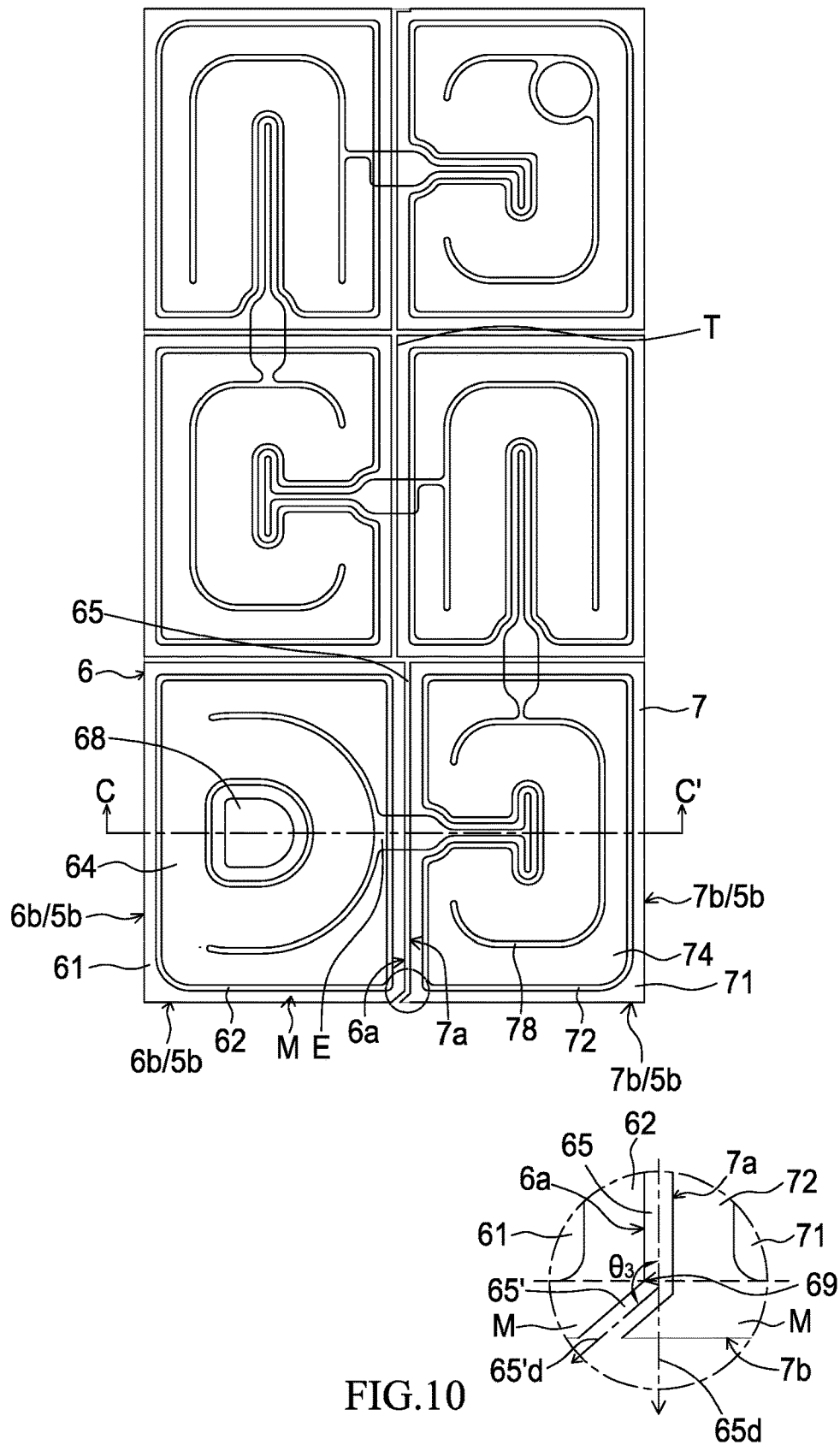
FIG. 10 illustrates a top view of light-emitting structure units in accordance with an embodiment of the present invention.
Figure 11:
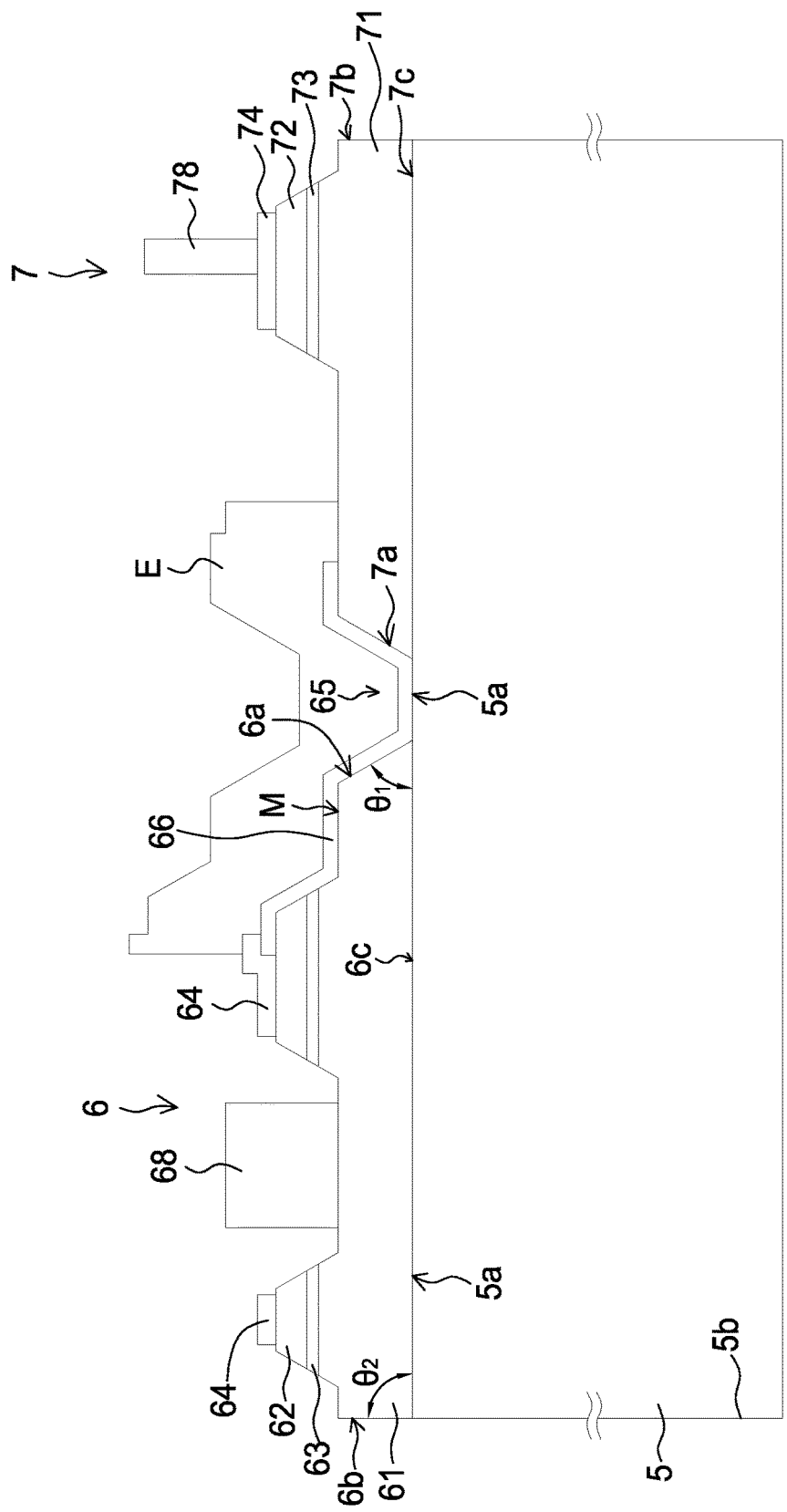
FIG. 11 illustrates a cross sectional view of the light-emitting structure unit along the line C-C' of FIG. 10.

FIG. 10 shows a top view of light-emitting structure in accordance with another embodiment of the present invention. FIG. 11 shows a cross section of the light-emitting structure along line C-C' shown in FIG. 10. The light-emitting structure in the present embodiment comprises a first light emitting structure unit 6 and a second light-emitting structure unit 7 adjacent to the first light emitting structure unit 6, and they are separated by a first trench 65. The first light-emitting structure unit 6 and a second light-emitting structure unit 7 are commonly formed on a substrate 5. An electrical connection E is arranged on the first light-emitting structure unit 6 and the second light-emitting structure unit 7 and electrically connects the first light-emitting structure unit 6 and the second light-emitting structure unit 7. The first light-emitting structure unit 6 includes a lower layer 61, an upper layer 62, and an active layer 63 between the lower layer 61 and the upper layer 62, which are sequentially formed on a substrate 5 by epitaxial growth or bonding method such as metal boding, fusion bonding, and glue bonding. The upper layer 62 locates on of the lower layer 61, and the lower layer 61 comprises a mesa area M surrounding the upper layer 62 from the top view of the light-emitting structure. In the embodiment, the first light-emitting structure unit 6 further comprises a first current spreading layer 64 formed on the upper layer 62 for facilitating the current spreading, and a first bonding pad 68 formed on the lower layer 61 for providing a bonding area of the light-emitting structure. In the present embodiment, the electrical connection E is arranged on the mesa area M. The first light-emitting structure unit 6 comprises a first side surface 6a, a second side surface 6b and a bottom surface 6c connecting the first side surface 6a and the second side surface 6b. The first side surface 6a is inclined and comprises a slope which is gentler than a slope of the second side surface 6b. The first side surface 6a is located near the first trench 65 and between the first light-emitting structure unit 6 and the second light-emitting structure unit 7. The second side surface 6b is more distant from the first trench 65 than the first side surface 6a is, and the second side surface 6b is not between the first light-emitting structure unit 6 and the second light-emitting structure unit 7. In one embodiment, the first side surface 6a can be a step-like side surface for improving the light extraction efficiency. According to the present application, the first light-emitting structure unit 6 may comprise several edges from a top view of the light-emitting structure. In the present embodiment shown in FIG. 10, the light-emitting structure unit 6 comprises a rectangular based shape comprising four edges. The first side surface 6a and the second side surface 6b can be respectively arranged on two of the edges. The first side surface 6a can be connected to the second side surface 6b directly, or the first side surface 6a can be opposite to the second side surface 6b, such as shown in the present embodiment. The electrical connection E is arranged on the first side surface 6a, while the second side surface 6b is devoid of the electrical connection E arranged thereon. An insulating layer 66 is arranged between the first side surface 6a and the electrical connection E to avoid undesirable current conduction. Besides, the substrate 5 comprises a top surface 5a faces the first light-emitting structure unit 6, and the first side surface 6a and the second side surface 6b directly connect to the top surface 5a of the substrate 5. The first light-emitting structure unit 6 is formed on the top surface 5a of the substrate 5, and the bottom surfaces 6c is adjacent to the top surface 5a of the substrate 5. From a top view of the light-emitting structure, the top surface 5a is exposed by the first trench 65, while the side surface 5b of the substrate 5 connects to the second side surface 6b of the first light-emitting structure unit 6, so that the top surface 5a of the substrate 5 is not exposed by the first light-emitting structure unit 6 at the position where the second side surface 6b located, which is similar with the light-emitting structure units shown in FIGS. 1 and 8F. The first side surfaces 6a connects to the bottom surface 6c with a first angle $\theta_1$, and a second angle $\theta_2$ is between the second side surface 6b and the bottom surface 6c The second angle $\theta_2$ can be larger than the first angle $\theta_1$. In one embodiment, the first angle $\theta_1$ can be smaller than 90 degrees, preferably can be smaller than 80 degrees. In the present embodiment shown in FIG. 11, the first angle $\theta_1$ can be between about 40 degrees and 70 degrees. The second angle $\theta_2$ can be between about 80 degrees and 100 degrees, more preferably, the second side surface 6b can be perpendicular with the bottom surface 6c which means the second angle $\theta_2$ can be approximately 90 degrees.

Likewise, the second light-emitting structure unit 7 can comprise the same or similar structure with the first light-emitting structure unit 6. The second light-emitting structure unit 7 includes lower layer 71, an upper layer 72, an active layer 73 between the lower layer 71 and the upper layer 72, a second current spreading layer 74, and a finger electrode 78, which are sequentially formed on a substrate 5. The second light-emitting structure unit 7 also comprises a first side surface 7a, a second side surface 7b and a bottom surface 7c connecting to the first side surface 7a and the second side surface 7b, while the first side surface 7a is inclined and a slope of the first side surface 7a is gentler than a slope of the second side surface 7b. The first side surface 7a is located near the first trench 65 and formed between the first light-emitting structure unit 6 and the second light-emitting structure unit 7. The second side surface 7b is more distant from the first trench 65 than the first side surface 7a is, and the second side surface 7b is not between the first light-emitting structure unit 6 and the second light-emitting structure unit 7. According to the present application, the second light-emitting structure unit 7 may comprise several edges from the top view of the light-emitting structure, and the first side surface 7a and the second side surface 7b can be arranged on the different edges. The first side surface 7a can be directly connected to the second side surface 7b, or the first side surface 7a can be opposite to the second side surface 7b, such as shown in the present embodiment. Besides, in the embodiment, the side surface 5b of the substrate 5 connects to the second side surface 7b of the second light-emitting structure unit 7, so that the top surface 5a of the substrate 5 is not exposed by the second light-emitting structure unit 7 at the position where the second side surface 7b located.

In the embodiment shown in FIG. 10, the light-emitting structure comprises six light-emitting structure units electrically connected with each other to form a high voltage LED, including the first light-emitting structure unit 6, the second light emitting structure unit 7 and the other four light-emitting structure units. An area of a top surface of the first light-emitting structure unit 6 is different from that of the second light-emitting structure unit 7 from a top view of the light-emitting structure. In the present embodiment, an area of a top surface of each of the other four light-emitting structure units is larger than that of the second light-emitting structure unit 7 and smaller than that of the first light-emitting structure unit 6 from a top view of the light-emitting structure. The first light-emitting structure unit 6 with the first bonding pad 68 has larger top surface than the other units for increasing the current spreading ability of the light-emitting structure. A trench T between two of the light-emitting structure units, which are other than the units 6 and 7, can be misalign with the first trench 65 between the first light-emitting structure unit 6 and the second light-emitting structure unit 7. In the present embodiment, the light-emitting structure further comprises a second trench 65' connecting to the first trench 65 and the second side surfaces 6b. There is a turn 69 between the first trench 65 and the second trench 65'. The turn 69 in the embodiment can be blunt to avoid any electrostatic discharge issue incurred. However, in another embodiment, the turn 69 can be sharp. According to the embodiment as shown in FIG. 10, the first trench 65 comprises a first extending direction 65d while the second trench 65' comprises a second extending direction 65d' different from the first extending direction 65d, and a third angle $\theta_3$ is between the first extending direction 65d and the second extending direction 65d'. The value of the third angle $\theta_3$ can be represent to an angle of the turn 69. In the embodiment, the third angle $\theta_3$ can be higher than 90 degrees, and the position of the turn 69 can be approximately aligned with the edges of the upper layers 62, 72 of the first light-emitting structure unit 6 and the second light-emitting structure unit 7 from the top view of the light-emitting structure. For example, the third angle $\theta_3$ can be between about 120 degrees and 150 degrees, more preferably, the third angle $\theta_3$ can be between about 130 degrees and 140 degrees.

It should be noted that the proposed various embodiments are for explanation but not for the purpose to limit the scope of the disclosure. Any possible modifications without departing from the spirit of the disclosure may be made and should be covered by the disclosure. The similar or same elements or the elements with the same reference numeral in different embodiments have identical chemical or physical characters. Besides, the elements shown in different embodiments mentioned above could be combined or replaced with one another in proper situation. The connecting relationship of specific element particularly described in one embodiment could also be applied in another embodiment, and the subject matter which comprises the elements in different embodiments all fall within the scope of the following claims and their equivalents.

What is claimed is:

1. A light-emitting structure, comprising: a first light-emitting structure unit and a second light-emitting structure unit, adjacent to and spaced apart from each other; a first trench and a second trench between the first light-emitting structure unit and the second light-emitting structure unit; an electrical connection arranged on the first light-emitting structure unit and the second light-emitting structure unit, electrically connecting the first light-emitting structure unit and the second light-emitting structure unit; and a turn between the first trench and the second trench; wherein the first light-emitting structure unit comprises a first side surface and a second side surface, and the first side surface is between the first light-emitting structure unit and the second light-emitting structure unit, and the second side surface is not between the first light-emitting structure unit and the second light-emitting structure unit; wherein the first side surface is inclined and a slope of the first side surface is gentler than a slope of the second side surface; wherein the second trench connects to the first trench and the second side surface; and wherein an angle of the turn is larger than 90 degrees.

2. The light-emitting structure of claim 1, further comprising a substrate which the first light-emitting structure unit and the second light-emitting structure unit are formed thereon; wherein a top surface of the substrate is not exposed by the first light-emitting structure unit at the position where the second side surface located.

3. The light-emitting structure of claim 1, wherein an area of a top surface of the first light-emitting structure unit is larger than that of the second light-emitting structure unit from a top view.

4. The light-emitting structure of claim 1, wherein the angle of the turn is between about 120 degrees and 150 degrees.

5. The light-emitting structure of claim 1, further comprising a third light-emitting structure unit adjacent to the first light-emitting structure unit and a fourth light-emitting structure unit adjacent to the second light-emitting structure unit; wherein an area of a top surface of each of the third and the fourth light-emitting structure units is larger than that of the second light-emitting structure unit and smaller than that of the first light-emitting structure unit from a top view.

6. The light-emitting structure of claim 1, wherein in a top view, the second light-emitting structure unit comprises a protrusion adjacent to the second trench and protruding toward the first light-emitting structure unit.

7. The light-emitting structure of claim 1, wherein the first light-emitting structure unit comprises a bottom surface connecting to the first side surface, and a first angle between the first side surface and the bottom surface is smaller than 80 degrees.

8. The light-emitting structure of claim 1, wherein the first light-emitting structure unit comprises a bottom surface connecting to the second side surface, and a second angle between the second side surface and the bottom surface is approximately 90 degrees.

9. The light-emitting structure of claim 1, wherein the electrical connection is arranged on the first side surface.

10. The light-emitting structure of claim 1, wherein the second side surface is devoid of the electrical connection arranged thereon.

11. The light-emitting structure of claim 1, wherein the first light-emitting structure unit comprises a lower layer and an upper layer on the lower layer; wherein the lower layer comprises a mesa area surrounding the upper layer from a top view of the light-emitting structure.

12. The light-emitting structure of claim 11, further comprising a substrate which the first light-emitting structure unit and the second light-emitting structure unit are formed thereon;
wherein a top surface of the substrate is not exposed by the first light-emitting structure unit at the position where the second side surface is located.

13. The light-emitting structure of claim 1, further comprising a bonding pad formed on the first light-emitting structure unit.

* * * * *